(12) United States Patent
Bu et al.

(10) Patent No.: US 7,804,714 B1
(45) Date of Patent: *Sep. 28, 2010

(54) SYSTEM AND METHOD FOR PROVIDING AN EPROM WITH DIFFERENT GATE OXIDE THICKNESSES

(75) Inventors: Jiankang Bu, Windham, ME (US); William S. Belcher, Cape Elizabeth, ME (US); David Courtney Parker, Topsham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 11/709,290

(22) Filed: Feb. 21, 2007

(51) Int. Cl.
*G11C 16/04* (2006.01)

(52) U.S. Cl. .............. 365/185.18; 365/187; 365/185.26; 365/185.27; 365/149; 365/150; 365/182

(58) Field of Classification Search .................. 365/187, 365/185.26, 185.18, 185.27, 149, 150, 182
See application file for complete search history.

(56) References Cited

U.S. PATENT DOCUMENTS

| | | | |
|---|---|---|---|
| 5,086,331 A * | 2/1992 | Hartgring et al. ............ 257/529 |
| 5,617,350 A * | 4/1997 | Roohparvar ........... 365/185.02 |
| 5,753,950 A | 5/1998 | Kojima |
| 5,790,455 A | 8/1998 | Caywood |
| 6,044,012 A * | 3/2000 | Rao et al. .................... 365/182 |
| 6,388,915 B1 | 5/2002 | Kato et al. |
| 6,421,293 B1 | 7/2002 | Candelier et al. |
| 6,525,955 B1 | 2/2003 | Smith et al. |
| 6,667,902 B2 | 12/2003 | Peng |
| 6,670,824 B2 | 12/2003 | Goodbread et al. |
| 6,842,372 B1 | 1/2005 | Hu |
| 6,927,997 B2 | 8/2005 | Lee et al. |
| 7,110,278 B2 | 9/2006 | Keshavarzi et al. |
| 7,349,281 B2 * | 3/2008 | Kouchi et al. ............ 365/225.7 |
| 7,483,310 B1 | 1/2009 | Bu |
| 2007/0064488 A1 | 3/2007 | Tanaka |
| 2007/0247914 A1 | 10/2007 | Fang et al. |

OTHER PUBLICATIONS

Johns et al., Analog Integrated Circuit Design, Wiley & Sons, 1997, pp. all, but particularly 31-32.*
Jinbong Kim et al., "Three-Transistor One-Time Programmable (OTP) ROM Cell Array Using Standard CMOS Gate Oxide Antifuse," IEEE Electron Device Letters, vol. 24, No. 9, Sep. 2003, pp. 589-591.

(Continued)

*Primary Examiner*—Hoai V Ho
*Assistant Examiner*—Fernando N Hidalgo

(57) ABSTRACT

A system and method are disclosed for providing an electrically programmable read only memory (EPROM) in which each memory cell comprises an NMOS select transistor with a thick gate oxide and a PMOS breakdown transistor with a thin gate oxide. The source of the NMOS transistor and the source, drain and N well of the PMOS transistor are connected. The gate of the PMOS transistor is grounded. Under the control of the NMOS transistor, a programming voltage pulse is passed to the N well of the PMOS transistor of a selected memory cell. The magnitude of the voltage is sufficient to break the thin gate oxide of the PMOS transistor without damaging the NMOS transistor. Because the memory state of the memory cell depends on the breakdown status of the PMOS transistor, the data may be retained in the memory cell for an unlimited period of time.

23 Claims, 7 Drawing Sheets

OTHER PUBLICATIONS

M. Fliesler et al., "A Novel Embedded OTP NVM Using Standard Foundry CMOS Logic Technology," ICMTD-2005, pp. 275-277.

"A 64-Bit High-Density OTP ROM Array with 3-Transistor Cell Standard CMOS Gate-Oxide Antifuse," 25 pages.

* cited by examiner

US 7,804,714 B1

SYSTEM AND METHOD FOR PROVIDING AN EPROM WITH DIFFERENT GATE OXIDE THICKNESSES

CROSS REFERENCE TO RELATED APPLICATION

A related patent application is being filed concurrently with the patent application. The related patent application is entitled "System and Method for Providing a Low Voltage Power EPROM Based on Gate Oxide Breakdown" and has been assigned Ser. No. 11/708,956. The related patent application and the inventions disclosed therein are assigned to the assignee of the present invention and are incorporated herein by reference for all purposes as if fully set forth herein.

TECHNICAL FIELD OF THE INVENTION

The present invention is generally directed to the manufacture of integrated circuits and, in particular, to a system and method for providing an electrically programmable read only memory (EPROM) with different gate oxide thicknesses.

BACKGROUND OF THE INVENTION

Electrically programmable read only memory (EPROM) must maintain the integrity of stored data for ten (10) years. In a memory cell of a prior art EPROM hot electrons are generated by impact ionization in a channel. Then some of the channel hot electrons are injected through a tunnel oxide to a polysilicon floating gate. Electrons (in amounts that represent either a zero ("0") representation or a one ("1") representation) are injected to the floating gate. The electron concentration in the floating gate determines the state of the data (i.e., "zero" or "one") that is stored in the memory cell.

The thickness of the tunnel oxide between the floating gate and the substrate in a prior art EPROM is typically one hundred twenty Ångstroms (120 Å). An Ångstrom is $10^{-10}$ meter. A value of thickness of the tunnel oxide of 120 Å is sufficient to reduce the back-tunnel current to acceptable levels and maintain a sufficient number of electrons on the floating gate to meet the ten (10) year data integrity requirement at a temperature of one hundred twenty five degrees Celsius (125° C.).

Integrated circuit design continues to trend toward smaller and smaller dimensions. EPROM designs have recently been proposed in which the thickness of the tunnel oxide is sixty Ångstroms (60 Å). This presents difficulties because the thinner thickness of sixty Ångstroms (60 Å) will not provide as much isolation for the electrons on the floating gate. That is, the electrons that are stored on the floating gate will discharge to the substrate at a much faster rate when the tunnel oxide is thinner. Experience in the EPROM industry has shown that it is very difficult to obtain a ten (10) year data retention rate when the thickness of the tunnel oxide is reduced to a thickness of sixty Ångstroms (60 Å). Complex and expensive measures are required to ensure that a ten (10) year data retention rate can be maintained in an EPROM that has a tunnel oxide that is only sixty Ångstroms (60 Å) thick.

Therefore, there is a need in the art for a system and method that is capable of providing an EPROM that has a tunnel oxide layer that is sixty Ångstroms (60 Å) thick and that is also capable of meeting the ten (10) year data retention requirement.

One advantageous embodiment of the present invention provides an electrically programmable read only memory (EPROM) memory cell that comprises an n-channel metal oxide semiconductor (NMOS) select transistor with a gate oxide layer that is sixty Ångstroms (60 Å) thick and a p-channel metal oxide semiconductor (PMOS) breakdown transistor with a gate oxide layer that is twenty Ångstroms (20 Å) thick. The source of the NMOS transistor and the source, drain and N well of the PMOS transistor are connected. The gate of the PMOS transistor is grounded.

Under the control of the NMOS transistor, a programming voltage pulse is passed to the N well of the PMOS transistor of a selected memory cell. The magnitude of the voltage is sufficient to break the twenty Ångstrom (20 Å) thickness of the gate oxide layer of the PMOS transistor without damaging the NMOS transistor. Because the memory state of the memory cell depends on the breakdown status of the PMOS transistor, the data may be retained in the memory cell for an unlimited period of time.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged semiconductor device.

Figure 1:
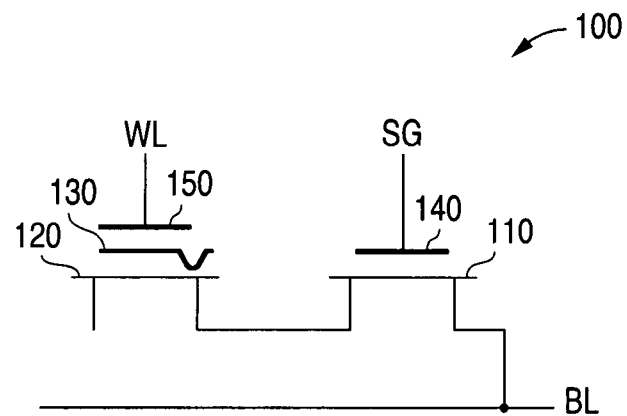
FIG. 1 illustrates a schematic diagram of a portion of a prior art electrically erasable programmable read only memory (EEPROM) device.

FIG. 1 illustrates a schematic diagram 100 of a portion of a prior art electrically erasable programmable read only memory (EEPROM) device. The portion of the prior art EEPROM shown in FIG. 1 comprises a select transistor 110 and a program transistor 120. The program transistor 120 comprises a floating gate 130. A tunnel oxide layer (not shown in FIG. 1) is located underneath the floating gate 130. Portions of the tunnel oxide layer form a tunnel window through which hot electrons are injected into the floating gate 130.

The gate 140 of the select transistor 110 is designated with the letters SG (for select gate). The source of the select transistor 110 is connected to a bitline voltage (designated with the letters BL) of a memory cell (not shown). The gate 150 of the program transistor 120 is connected to a wordline voltage (designated with the letters WL) of the memory cell (not shown).

Figure 2:
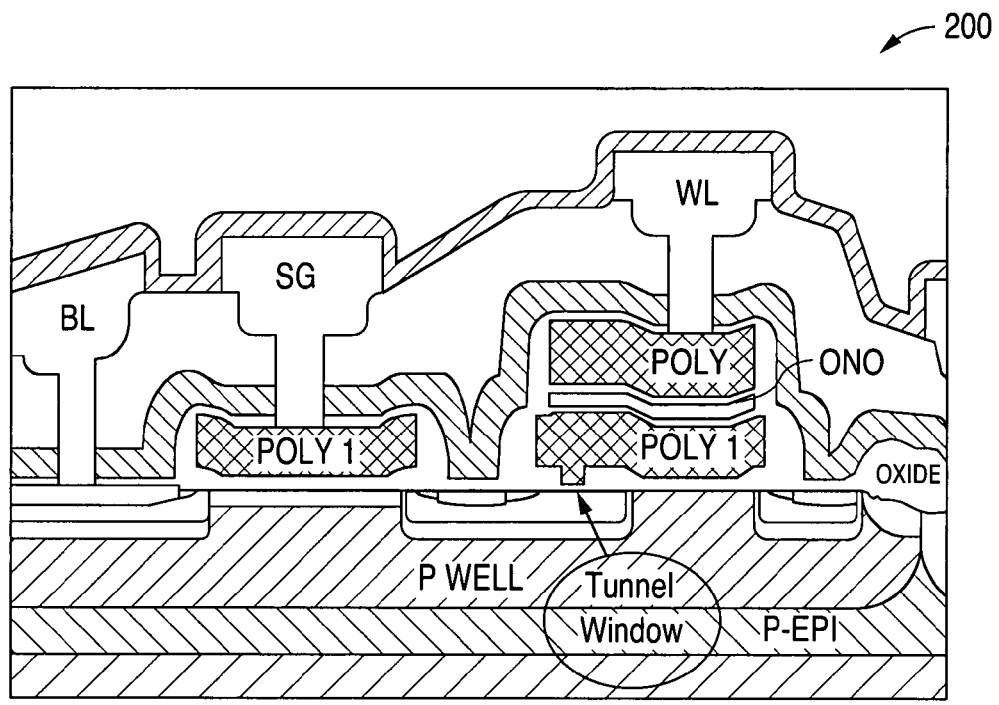
FIG. 2 illustrates a diagram of a cross section of a portion of a prior art electrically erasable programmable read only memory (EEPROM) device.

FIG. 2 illustrates a diagram 200 of a cross sectional view of a portion of a prior art electrically erasable programmable read only memory (EEPROM) device. As shown in FIG. 2, a relatively thin tunnel window is formed in the tunnel oxide layer under the floating gate (designated POLY1) of the program transistor.

The select transistor 110 selectively passes a bitline voltage BL from the bitline to the tunnel window. Depending on the relative value of the wordline voltage WL and the bitline voltage BL, a high value of electric field across the tunnel window will cause electron Fowler-Nordheim (FN) tunneling to the floating gate 130 or tunneling back from the floating gate 130 to the substrate.

If the voltage across the tunnel window is sufficiently high, or if the thickness of the tunnel window is sufficiently thin, then the Fowler-Nordheim (FN) tunneling process will change to an oxide breakdown process. The system and method of the present invention uses this phenomenon to provide an improved EPROM memory cell.

Figure 3:
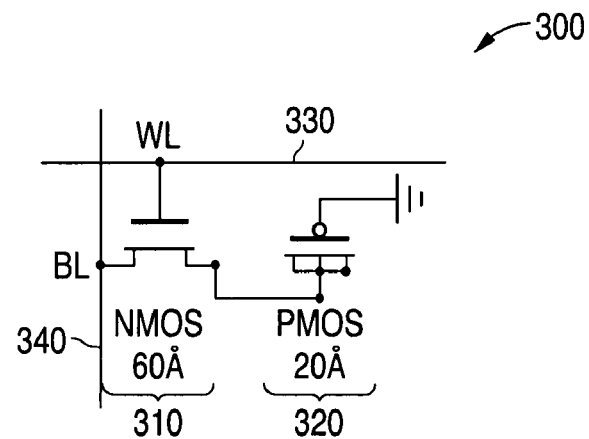
FIG. 3 illustrates a schematic diagram of a memory cell of the present invention showing an electrically programmable read only memory (EPROM) device of the present invention.

FIG. 3 illustrates a schematic diagram of a memory cell 300 of the present invention showing an advantageous embodiment of an electrically programmable read only memory (EPROM) device of the present invention. The EPROM memory cell 300 of the present invention comprises an n-channel metal oxide semiconductor (NMOS) select transistor 310 and a p-channel metal oxide semiconductor (PMOS) breakdown transistor 320. In the advantageous embodiment of the EPROM memory cell 300 shown in FIG. 3, the NMOS select transistor 310 has a gate oxide thickness of sixty Ångstroms (60 Å) and the PMOS breakdown transistor 320 has a gate oxide thickness of twenty Ångstroms (20 Å). The NMOS select transistor 310 also functions as a read transistor for the memory cell 300.

As shown in FIG. 3, the gate of the NMOS select transistor 310 is connected to a wordline 330 designated with the letters WL. The drain of the NMOS select transistor 310 is connected to a bitline 340 designated with the letters BL.

The gate of the PMOS breakdown transistor 320 is connected to ground. The source of the NMOS select transistor 310, and the drain, the source and the N Well of the PMOS breakdown transistor 320 are all connected together.

Figure 4:
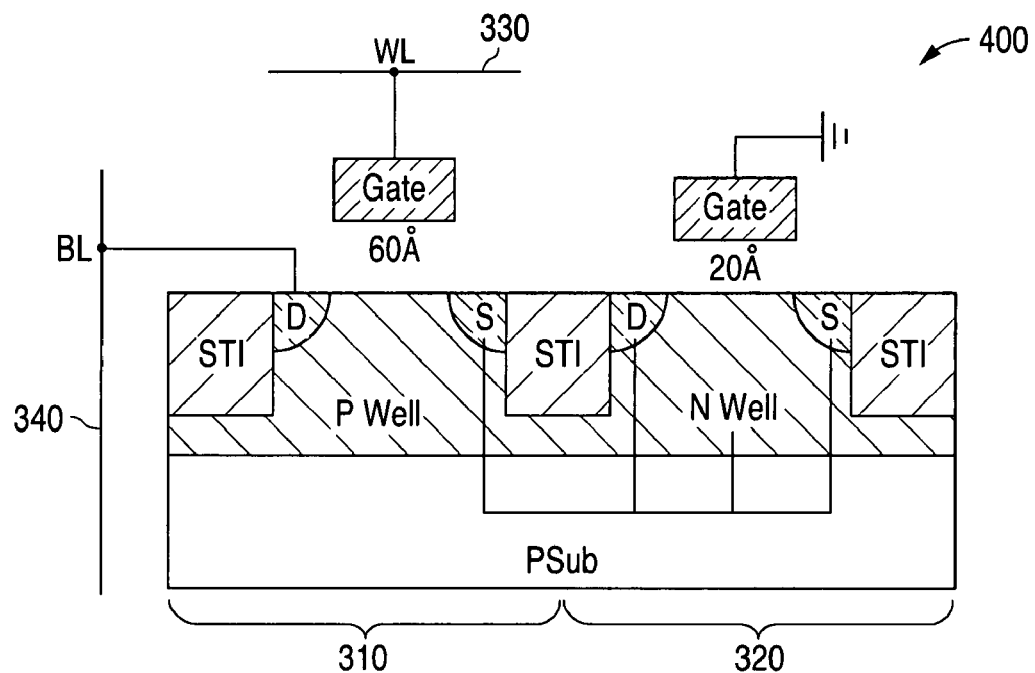
FIG. 4 illustrates a cross sectional view of a memory cell of the present invention showing a cross sectional view of an electrically programmable read only memory (EPROM) device of the present invention.

FIG. 4 illustrates a cross sectional view 400 of a memory cell 300 of the present invention. The letters STI in FIG. 4 stand for "shallow trench isolation" structures that electrically isolate the NMOS select transistor 310 and the PMOS breakdown transistor 320. The letters "PWell" designate the P well of the NMOS transistor 310. The letters "Well" designate the N well of the PMOS breakdown transistor 320. The letters "PSub" designate the P substrate of the transistors 310 and 320.

Under the control of the NMOS select transistor 310, a program voltage pulse is selectively passed to the N Well of the PMOS breakdown transistor 320. The magnitude of the program voltage pulse is selected so that it is sufficient to break the twenty Ångstrom (20 Å) gate oxide of the PMOS breakdown transistor 320. The magnitude of the program voltage pulse is also selected so that it is insufficient to damage the sixty Ångstrom (60 Å) gate oxide (or any other portion) of the NMOS select transistor 310.

The EPROM memory cell 300 of the present invention is organized so that (1) the voltage on the wordline (WL) 330 controls the on and off status of the NMOS select transistor 310, and (2) the voltage on the bitline (BL) 340 provides the program voltage and the read value. The sequence and timing of the voltages that are provided to the wordline (WL) 330 and to the bitline (BL) 340 determine which memory cell in a memory array is to be programmed or read.

During the programming operation of memory cell 300, a voltage is provided to the wordline (WL) 330 that turns on the NMOS select transistor 310. The program voltage that is present on the bitline (BL) 340 is thus provided to the twenty Ångstrom (20 Å) gate oxide of the PMOS breakdown transistor 320. As previously mentioned, the magnitude of the program voltage is sufficient to break down the twenty Ångstrom (20 Å) gate oxide layer of the PMOS breakdown transistor 320 but is insufficient to damage the damage the sixty Ångstrom (60 Å) gate oxide layer (or any other portion) of the NMOS select transistor 310. The difference of forty Ångstroms (40 Å) between the first gate oxide thickness of sixty Angstroms (60 Å) of the NMOS select transistor 310 and the second gate oxide thickness of twenty Angstroms (20 Å) of the PMOS breakdown transistor 320 provides a sufficient margin to ensure that the NMOS select transistor 310 is not damaged.

Before the application of the programming process that breaks down the twenty Ångstrom (20 Å) gate oxide thickness, the low gate oxide leakage current through PMOS breakdown transistor 320 represents a "zero" memory state. A typical value of the low gate oxide leakage current may range from ten nanoamperes (10 nA) to one hundred nanoamperes (100 nA) for a read bias voltage of one volt (1V).

After the twenty Ångstrom (20 Å) gate oxide thickness of the PMOS breakdown transistor 320 has been broken down by the programming process, the high gate oxide leakage current through PMOS breakdown transistor 320 represents a "one" memory state. A typical value of the high gate oxide leakage current may range from one hundred microamperes (100 µA) to three hundred microamperes (300 µA). In contrast, the post programming breakdown current in prior art circuits such as poly fuse or anti-fuse technologies may be as high as one hundred milliamperes (100 mA).

During the read operation of memory cell 300, a voltage is provided to the wordline (WL) 330 that turns on the NMOS select transistor 310 and a low read bias voltage is provided to the bitline (BL) 340 of the memory cell 300. The NMOS select transistor 310 now functions as an NMOS read transistor 310. If the memory cell 300 has been previously programmed (i.e., the twenty Ångstrom (20 Å) gate oxide thickness of the PMOS breakdown transistor 320 has been broken down), then the bitline (BL) 340 will read a high current that represents the "one" memory state. Otherwise, the bitline (BL) 340 will read a low current that represents the "zero" memory state.

Because the status of the memory state in memory cell 300 is determined by whether or not the twenty Ångstrom (20 Å) gate oxide thickness of the PMOS breakdown transistor 320 has been broken down, the retention time of the data in memory cell 300 is infinitely long. The retention time is also not dependent on any known operating temperature that occurs in EPROM devices. Furthermore, unlike prior art memory cells, memory cell 300 of the present invention has no "read disturb" or "program disturb" issues with respect to any other memory cells in a memory array.

The amount of current that is required to carry out the programming process for memory cell 300 is in the range of ten microamperes (10 μA) to one hundred microamperes (100 μA). A microampere is one millionth ($10^{-6}$) of an ampere. Prior art polysilicon type fuse or antifuse technologies require programming currents that are in the range of tens of milliamperes (10 s mA) to hundreds of milliamperes (100 s mA). A milliampere is one thousandth ($10^{-3}$) of an ampere. Therefore, the programming current required for the memory cell 300 of the present invention is one thousand (1000) times lower than the programming currents that are required for prior art EPROM programming methods.

Figure 5:
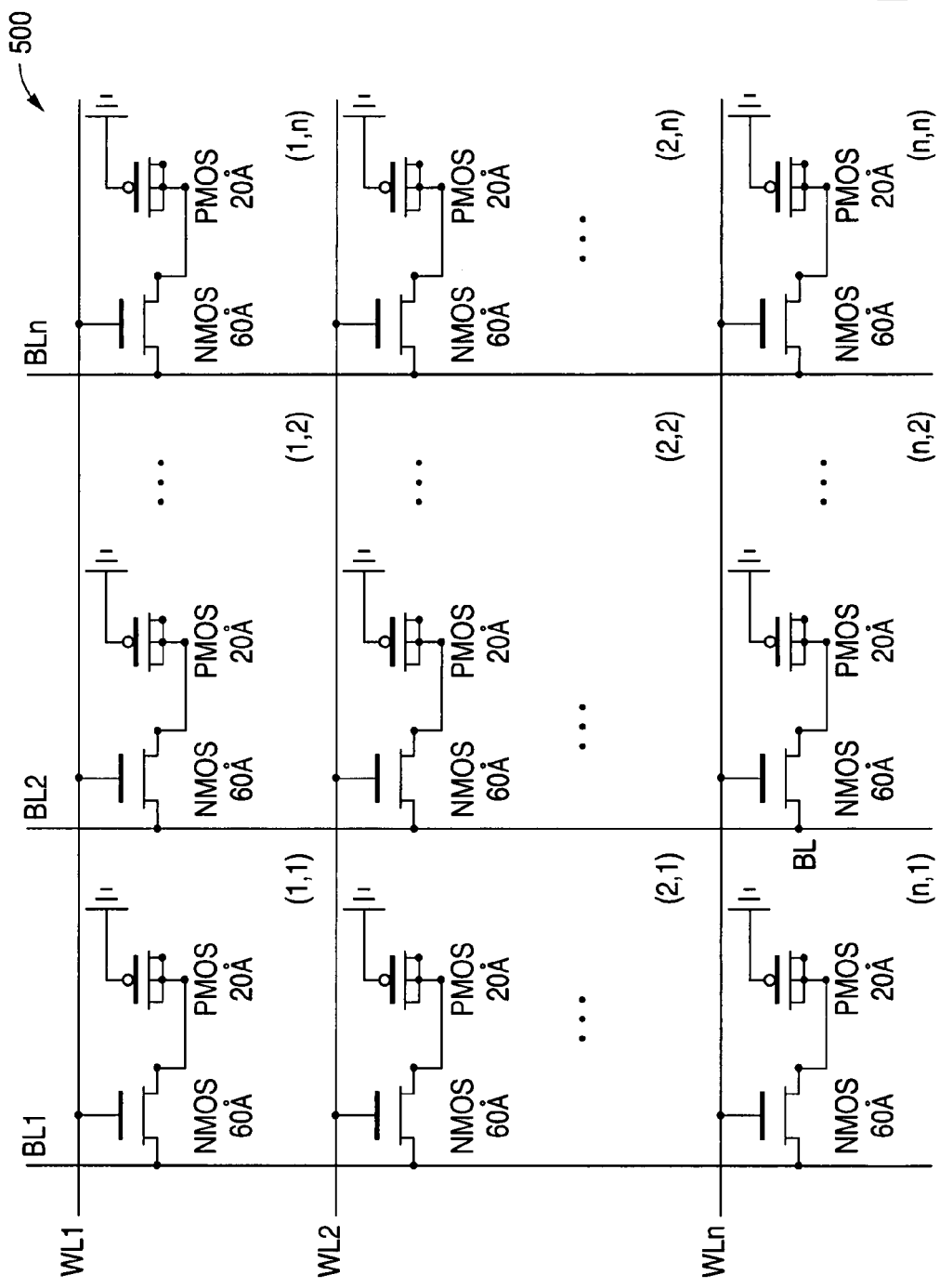
FIG. 5 illustrates a schematic diagram of an array of memory cells of the present invention in which each memory cell comprises an electrically programmable read only memory (EPROM) device of the present invention.

FIG. 5 illustrates a schematic diagram of an array 500 of memory cells 300 of the present invention in which each memory cell 300 comprises an electrically programmable read only memory (EPROM) device of the present invention. As shown in FIG. 5, array 500 comprises a plurality of n wordlines (WL1, WL2, ..., WLn) and a plurality of n bitlines (BL1, BL2, ..., BLn). The memory cells 300 in the first row are designated memory cell (1,1), memory cell (1,2), ..., memory cell (1, n). The memory cells 300 in the second row are designated memory cell (2,1), memory cell (2,2), ..., memory cell (2, n). The memory cells 300 in the last row are designated memory cell (n, 1), memory cell (n, 2), ..., memory cell (n, n).

Array 500 is configured as an exemplary NOR type array architecture. However, the memory cell 300 of the present invention is not limited to this exemplary NOR type array architecture. The memory cell 300 of the present invention can also be used in other types of array architecture such as a NAND type array architecture.

Table One shows an operation table for the memory cells 300 of the array 500 shown in FIG. 5.

TABLE ONE

|  | Selected WL | Selected BL | Unselected WL | Unselected BL |
|---|---|---|---|---|
| Program | Vhigh | Vprog | 0 | 0 |
| Read | Vlow | Vread | 0 | 0 |
| Retention | 0 | 0 | 0 | 0 |

An exemplary value of the WL high voltage (Vhigh) is seven volts (7 V). An exemplary value of the WL low voltage (Vlow) is two volts (2 V). An exemplary value of the BL program voltage (Vprog) is six volts (6 V). An exemplary value of the BL read voltage (Vread) is one volt (1 V).

During the programming operation of memory cell 300, the Vhigh voltage is provided to the selected wordline (WL) and the Vprog voltage is provided to the selected bitline (BL). Zero voltage is applied to the unselected wordlines (WL) and unselected bitlines (BL). The Vprog voltage is applied to and breaks down the twenty Ångstrom (20 Å) gate oxide layer of the PMOS breakdown transistor 320.

The other unselected memory cells in the array 500 are not disturbed and are not programmed. This is because each of the unselected memory cells do not receive both a Vhigh voltage on their respective wordline WL and a Vprog voltage on their respective bitline BL. For a first example, if there is a Vhigh voltage on the wordline WL of an unselected memory cell then the NMOS transistor 310 of the unselected memory cell will turn on but the bitline BL voltage will be zero. In this first example the unselected memory cell will not be programmed.

For a second example, if there is a Vprog voltage on the bitline BL of an unselected memory cell but there is a zero voltage on the wordline WL, then the NMOS transistor 310 of the unselected memory cell will not turn on even though the Vprog voltage on bitline BL is high. In this second example the unselected memory cell will not be programmed.

The system and method of the present invention is therefore capable of selectively programming one particular memory cell 300 in an array 500 of memory cells.

During the read operation of memory cell 300, the Vlow voltage is provided to the selected wordline (WL) and the Vread voltage is provided to the selected bitline (BL). Zero voltage is applied to the unselected wordlines (WL) and unselected bitlines (BL). The result of the read operation depends on the status of the twenty Ångstrom (20 Å) gate oxide layer of the PMOS breakdown transistor 320 (whether the gate oxide layer is broken down or is still intact). If a high gate oxide leakage current is detected the twenty Ångstrom (20 Å) gate oxide layer has been broken down and the memory state in memory cell 300 is a "one" memory state. If a low gate oxide leakage current is detected the twenty Ångstrom (20 Å) gate oxide layer is still intact and the memory state in the memory cell 300 is a "zero" memory state.

During the read operation of memory cell 300, the other unselected memory cells see only the Vlow voltage on their respective wordline line WL or the Vread voltage on their respective bitline BL (but not both voltages). Therefore, the other unselected memory cells do not contribute to the read current.

The system and method of the present invention is therefore capable of selectively reading one particular memory cell 300 in an array 500 of memory cells.

The other unselected memory cells in the array 500 are not disturbed during a read operation. The memory state of a memory cell 300 of the present invention depends on the breakdown status of the oxide layer in the PMOS breakdown transistor 320. Therefore, there is no "read disturb" to the data retention. Prior art technologies that store data by retaining electrons on a floating gate sometimes experience a disturbance when an adjacent memory cell is read. A memory cell 300 of the present invention does not experience "read disturb" problems.

It is true that the Vread voltage could damage the twenty Ångstrom (20 Å) gate oxide layer in the PMOS breakdown transistor 320 if the magnitude of the Vread voltage were set too high. However, because the Vread voltage is one volt (1 V) or less, the twenty Ångstrom (20 Å) gate oxide layer will remain undamaged by the Vread voltage.

Because the memory state of a memory cell 300 of the present invention depends on the breakdown status of the oxide layer in the PMOS breakdown transistor 320, the retention time for memory cell 300 is infinite in duration. Memory cell 300 has no erase capability. Lack of an erase capability is acceptable for an EPROM device.

Experimental data were collected and analyzed for an exemplary memory cell 300 of the present invention. The memory cell 300 that was tested comprised an NMOS select transistor 310 having a gate oxide thickness of sixty Ångstroms (60 Å), and a width of ten microns (10 µm) and a length of thirty eight hundredths of a micron (0.38 µm). The memory cell 300 that was tested also comprised a PMOS breakdown transistor 320 having a gate oxide thickness of twenty Ångstroms (20 Å), and a width of ten microns (10 µm) and a length of thirty five hundredths of a micron (0.35 µm). The results of the tests are set forth below.

Figure 6:
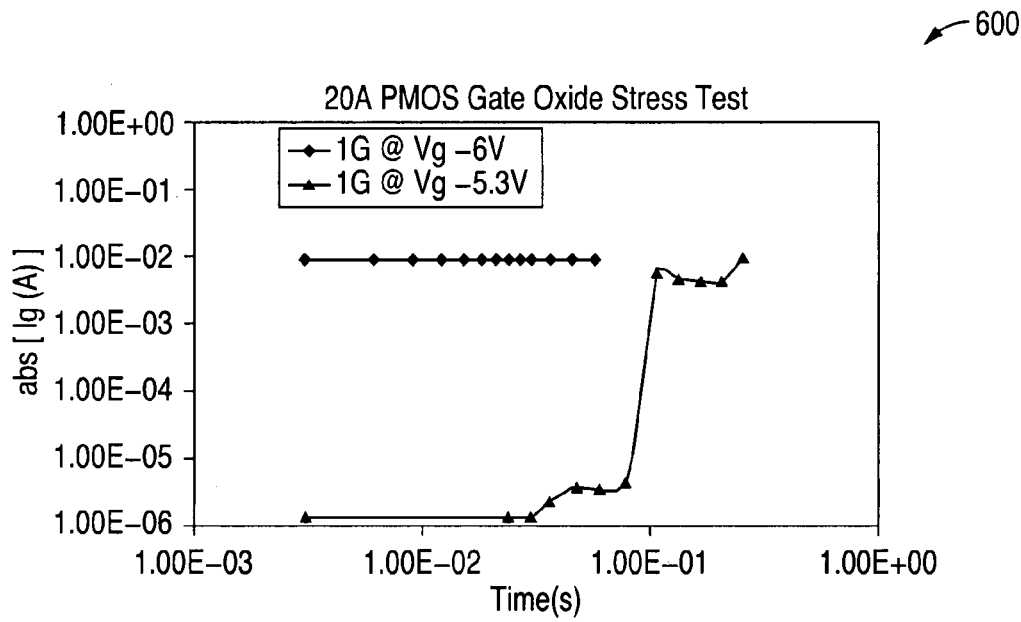
FIG. 6 illustrates a graph of current versus time showing the results of a gate oxide stress test for a PMOS twenty Ångstrom (20 Å) gate oxide transistor.
Figure 7:
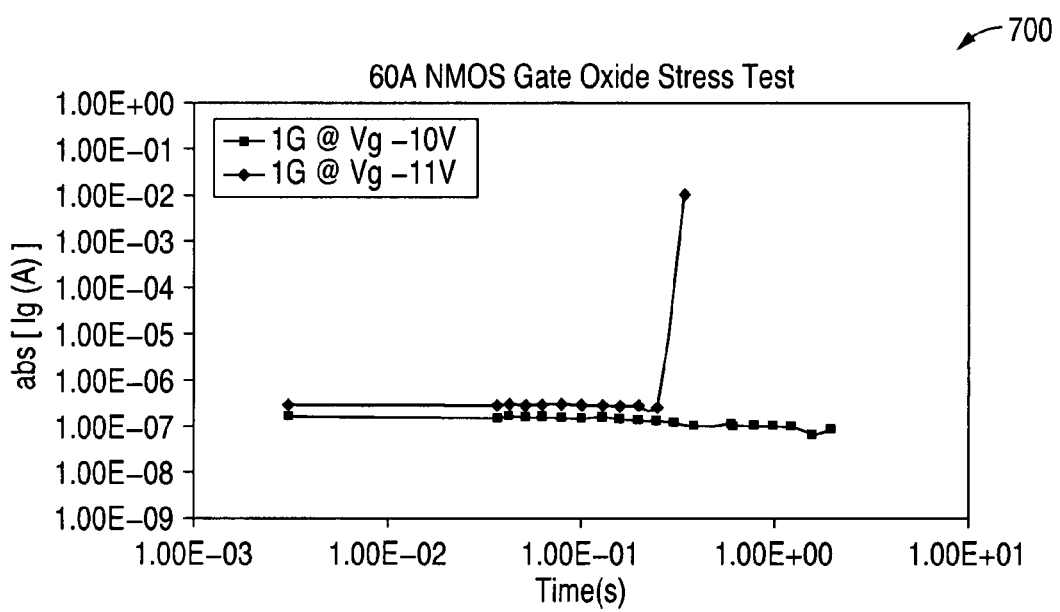
FIG. 7 illustrates a graph of current versus time showing the results of a gate oxide stress test for an NMOS sixty Ångstrom (60 Å) gate oxide transistor.

FIG. 6 and FIG. 7 show that there is a sufficient breakdown margin between the twenty Ångstrom (20 Å) gate oxide and the sixty Ångstrom (60 Å) gate oxide. FIG. 6 illustrates a graph 600 of current versus time showing the results of a gate oxide stress test for the PMOS twenty Ångstrom (20 Å) gate oxide transistor 320. FIG. 6 shows that when a bias voltage of six volts (6 V) is applied between the N Well and the twenty Ångstrom (20 Å) gate oxide of the PMOS breakdown transistor 320, breakdown occurs in less than three milliseconds (3 ms). For a bias voltage of five and three tenths volts (5.3 V), it takes one hundred milliseconds (100 ms) for the breakdown to occur.

FIG. 7 illustrates a graph 700 of current versus time showing the results of a gate oxide stress test for the NMOS sixty Ångstrom (60 Å) gate oxide transistor 310. FIG. 7 shows that a bias voltage of eleven volts (11 V) would not break down the sixty Ångstrom (60 Å) gate oxide until three hundred forty milliseconds (340 ms) had elapsed. FIG. 7 also shows that a bias voltage of ten volts (10 V) has not broken the sixty Ångstrom (60 Å) gate oxide after seconds have elapsed.

The experimental data shown in FIG. 6 and in FIG. 7 show that there is enough margin to break the twenty Ångstrom (20 Å) gate oxide of the PMOS breakdown transistor 320 and not break the sixty Ångstrom (60 Å) gate oxide of the NMOS select transistor 310 in the expected program time.

Figure 8:
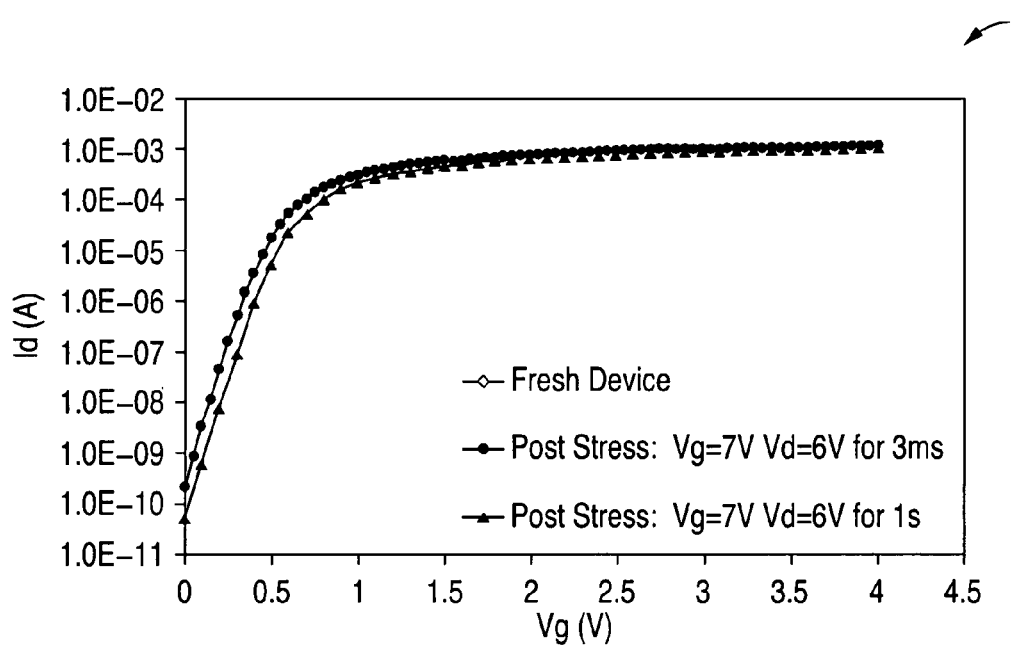
FIG. 8 illustrates a graph of drain current versus gate voltage of an NMOS select transistor showing the effect of program voltage on the gate oxide of the NMOS select transistor.

FIG. 8 illustrates a graph 800 of drain current (Id) versus gate voltage (Vg) for the NMOS select transistor 310 showing the effect of the program voltage Vprog on the gate oxide of the NMOS select transistor 310. The worst case stress to the NMOS select transistor 310 occurs after the break down of the twenty Ångstrom (20 Å) gate oxide layer in the PMOS breakdown transistor 320. At this point the NMOS select transistor 310 experiences a gate voltage (Vg) of seven volts (7 V) and a drain voltage (Vd) of six volts (6 V) and a source voltage (Vs) of approximately zero volts for up to three milliseconds (3 ms).

FIG. 8 shows the drain current (Id) versus gate voltage (Vg) characteristics of the NMOS select transistor 310 before and after the worst case stress. The data points for the post stress case after three milliseconds (3 ms) show no change from the data points for the unstressed case (i.e., "Fresh Device" in FIG. 8). That is, the data points for the unstressed case and post stress case after three milliseconds (3 ms) are substantially identical. The data points for the post stress case after one second (1 s) show only a slight degradation due to electron trapping. Because the memory cell 300 is programmed only one time, the impact of the three millisecond (3 ms) pulse of the program voltage Vprog on the sixty Ångstrom (60 Å) gate oxide layer in the NPMOS select transistor 310 is negligible.

Figure 9:
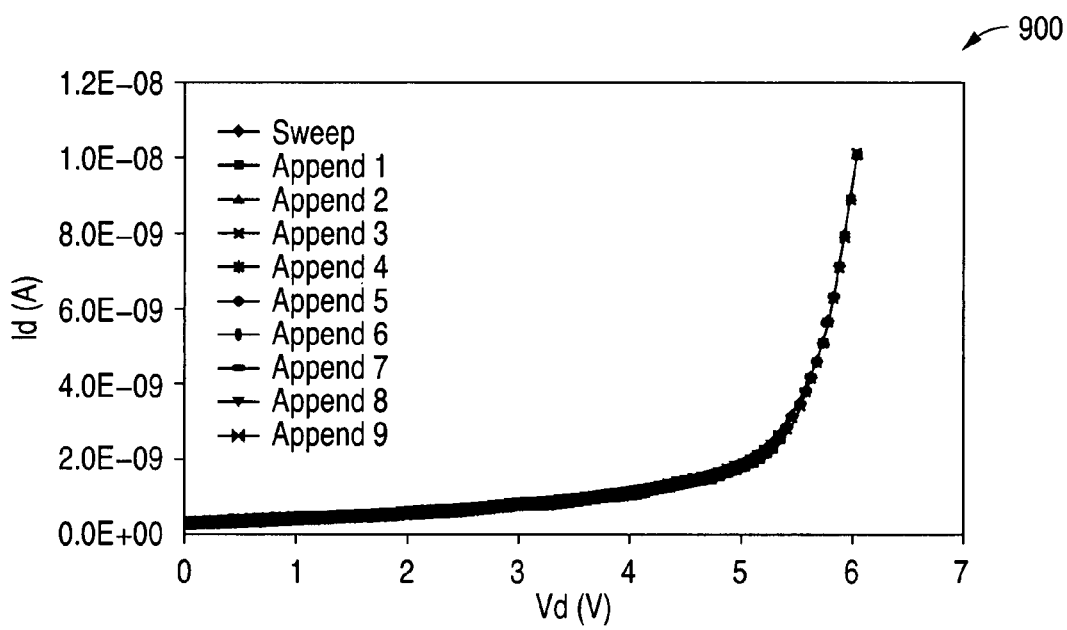
FIG. 9 illustrates a graph of drain current versus drain voltage of an NMOS select transistor showing the effect of program voltage on the drain junction of the NMOS select transistor.

FIG. 9 illustrates a graph 900 of drain current (Id) versus drain voltage (Vd) for the NMOS select transistor 310 showing the effect of the program voltage Vprog on the drain junction of the NMOS select transistor. During the programming operation of memory cell 300, the source/drain of the NMOS select transistor 310 will transfer the program voltage Vprog to the gate of the PMOS breakdown transistor 320. FIG. 9 illustrates nine (9) sweeps of voltage from zero volts (0 V) to six volts (6 V) applied to the drain junction of the NMOS select transistor 310. Very little change is observed between the sweeps. This result indicates that the three millisecond (3 ms) pulse of six volt (6 V) program voltage Vprog does not degrade the drain junction of the NMOS select transistor 310.

Figure 10:
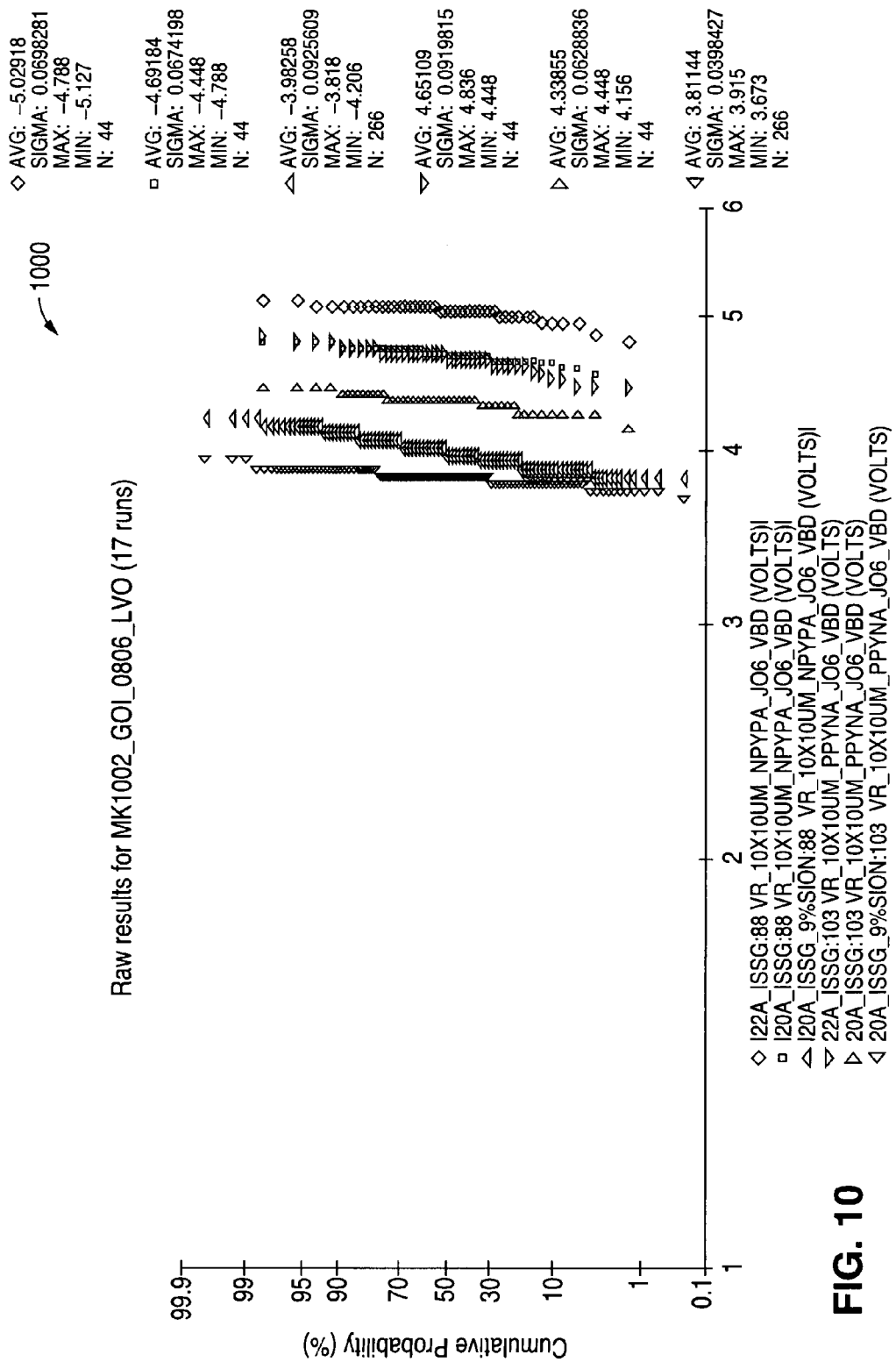
FIG. 10 illustrates a graph of cumulative probability versus a log scale of voltage showing gate oxide integrity (GOI) statistics for an array of memory cells of the present invention.

FIG. 10 illustrates a graph 1000 of cumulative probability versus a log scale of voltage showing gate oxide integrity (GOI) statistics for an array of memory cells 300 of the present invention. If the breakdown voltage (Vbd) for the twenty Ångstrom (20 Å) gate oxide layer in the PMOS breakdown transistor 320 has too much variation across the wafer of memory cells 300, then this will lead to tail bits in the EPROM array. There will be early breakdown or late breakdown in some of the bits.

FIG. 10 shows gate oxide integrity (GOI) statistics for six samples. The breakdown statistics are tight for each sample. All of the samples break down between three and a half volts (3.5 V) and five and a half volts (5.5 V). This indicates that the array statistics for memory cells 300 of the present invention are very good. No memory cell 300 will be broken by the read voltage of one volt (1V). All of the memory cells 300 will be broken by the program voltage of six volts (6 V).

When a read voltage of one volt (1 V) is applied to the bitline BL 340 of an unbroken memory cell 300, one must consider whether the one volt (1 V) read voltage constitutes a "read disturb" to the unbroken twenty Ångstrom (20 Å) gate oxide layer of the PMOS breakdown transistor 320. The GOI statistics shown in FIG. 10 show that such a possible "read disturb" is not a concern in an unbroken memory cell 300.

The memory cells 300 of the present invention do not require high current during the programming operation. After the programming operation has been completed, the memory cells 300 may be subjected to high levels of current. The effect of current spikes may be limited by adding a PMOS load to the bitlines BL to limit the maximum current experiences by the memory cells 300 to one hundred microamperes (100 µA). Alternatively, the width to length (W/L) ratio of the NMOS select transistors 310 may be reduced.

Generally speaking, gate oxide integrity (GOI) is one of the most well controlled, well documented and well understood parameters in a complementary metal oxide semiconductor (CMOS) platform. The present invention provides an improved EPROM device that is based on the principle of oxide breakdown. The improved EPROM device of the present invention uses features that are well suited for to be employed on existing CMOS platforms. The EPROM device of the present invention possesses the advantages of low cost, reliability, and a short technology development time.

The breakdown state of the EPROM device of the present invention can be maintained for hundreds of years in any known operating temperature that occurs in EPROM devices. For this reason the EPROM device of the present invention does not have the data retention problems that occur in some prior art technologies that utilize floating gate data storage.

The EPROM device of the present invention requires current on the order of microamperes (µA) to complete the programming operation. As previously mentioned, this level of current is one thousand (1000) times lower than the level of current required in prior art poly fuse technologies.

Figure 11:
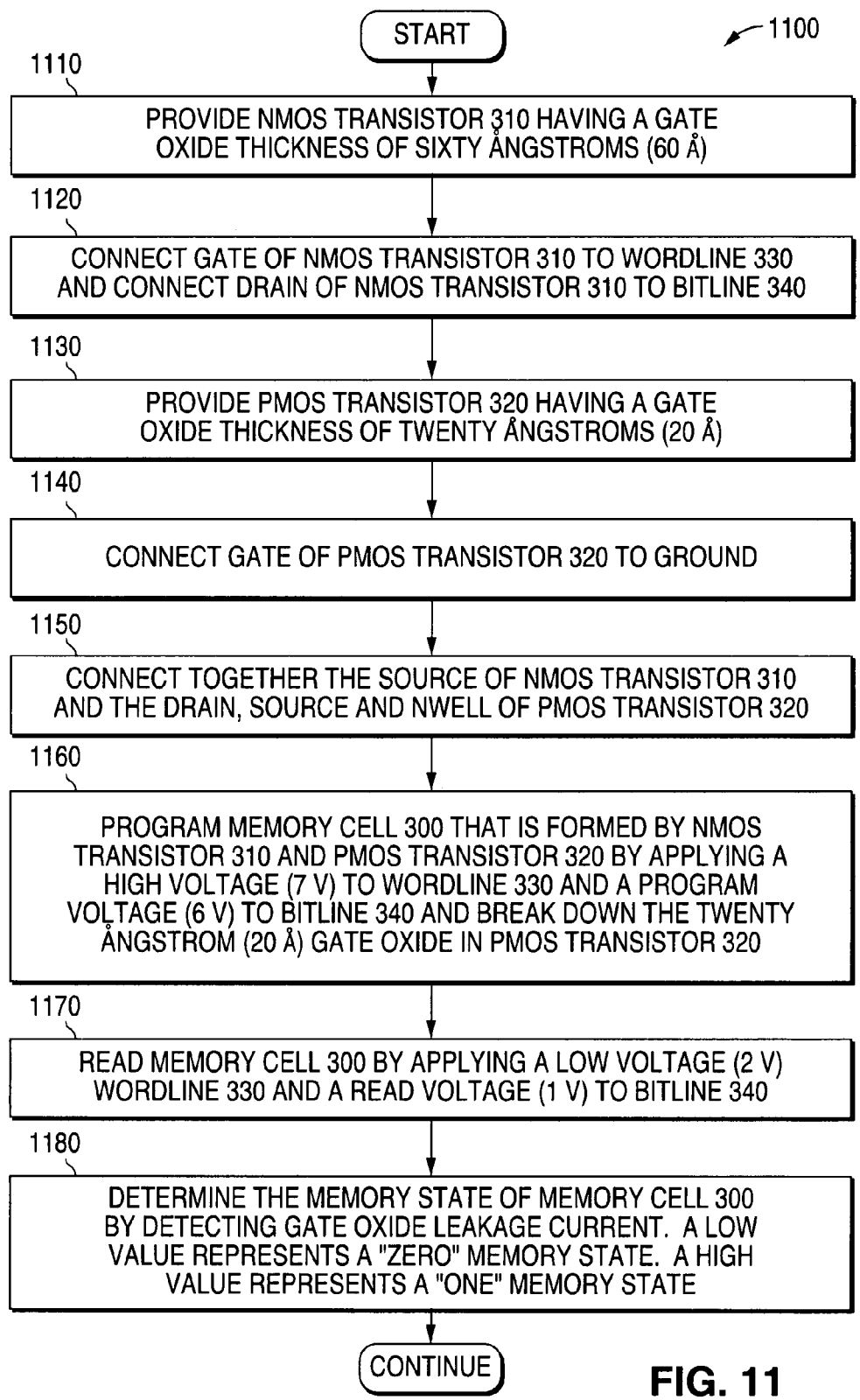
FIG. 11 illustrates a flow chart showing the steps of an advantageous embodiment of a method of the present invention.

FIG. 11 illustrates a flow chart 1100 showing the steps of an advantageous embodiment of the method of the present invention. In the first step of the method an NMOS select transistor 310 is provided that has a gate oxide thickness of sixty Ångstroms (60 Å) (step 1110). The gate of the NMOS select transistor 310 is connected to a wordline (WL) 330 and the drain of the NMOS select transistor 310 is connected to a bitline (BL) 340 (step 1120).

Then a PMOS breakdown transistor 320 is provided that has a gate oxide thickness of twenty Ångstroms (20 Å) (step 1130). Then the gate of the PMOS breakdown transistor 320 is connected to ground (step 1140). Then the source of the NMOS select transistor 310 and the drain, source and N Well of the PMOS breakdown transistor 320 are connected together (step 1150).

The memory cell 300 that is formed by the NMOS select transistor 310 and the PMOS breakdown transistor 320 is then programmed by applying a high voltage (7 V) to the wordline (WL) 330 and a program voltage (6 V) to the bitline (BL) 340 to break down the twenty Ångstrom (20 Å) gate oxide in the PMOS breakdown transistor 320 (step 1160).

Then the memory cell 300 is read by applying a low voltage (2 V) to the wordline (WL) 330 and a read voltage (1 V) to the bitline (BL) 340 (step 1170). The memory state of a memory cell 300 is determined by determining the gate oxide leakage current (step 1180). A low value of gate oxide leakage current (e.g., from ten nanoamperes (10 nA) to one hundred nanoamperes (100 nA)) represents a "zero" memory state. A high value of gate oxide leakage current (e.g., from one hundred microamperes (100 μA) to three hundred microamperes (300 μA)) represents a "zero" memory state.

The value of thickness of the gate oxide layer in the NMOS select transistor 310 has been selected to be sixty Ångstroms (60 Å). The value of thickness of the gate oxide layer in the PMOS breakdown transistor 320 has been selected to be twenty Ångstroms (20 Å). It is understood that these values are not the only values of thickness that can be used to carry out the principles of operation of the EPROM device of the present invention.

The first gate oxide thickness of the NMOS select transistor 310 must be thick enough so that it is not damaged when the second gate oxide thickness of the PMOS breakdown transistor 320 is subjected to sufficient current during the programming operation to cause the second gate oxide thickness to break. That is, there must be a sufficient oxide breakdown margin between the first gate oxide thickness and the second gate oxide thickness.

A sufficient oxide breakdown margin is provided when the first gate oxide thickness is sixty Ångstroms (60 Å) and the second gate oxide thickness is twenty Ångstroms (20 Å). However, the invention is not dependent upon using these specific values. Other values of thickness that provide a sufficient oxide breakdown margin may also be used.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A memory cell of an electrically programmable read only memory (EPROM), the memory cell comprising at most two transistors, including:
a select transistor that comprises an n-channel metal oxide semiconductor (NMOS) transistor having a gate oxide layer that has a thickness of approximately sixty Angstroms; and
a breakdown transistor connected to the select transistor, wherein the breakdown transistor comprises a p-channel metal oxide semiconductor (PMOS) transistor having a gate oxide layer that has a thickness of approximately twenty Angstroms, wherein the gate oxide layer of the PMOS transistor is broken down when exposed to a programming current in a range of ten microamperes to one hundred microamperes,
wherein the select transistor sources said programming current on to at least one of a drain, a source and an N well of the breakdown transistor, and
a gate of the breakdown transistor is connected to ground.

2. The memory cell as claimed in claim 1, wherein the thickness of the gate oxide layer of the NMOS transistor causes the gate oxide layer of the NMOS transistor to be undamaged when exposed to the programming current.

3. The memory cell as claimed in claim 2, wherein the select transistor experiences a gate voltage of seven volts and a drain voltage of six volts in response to the programming current.

4. The memory cell as claimed in claim 1, wherein the NMOS transistor comprises:
a drain connected to a bitline of the memory cell;
a gate connected to a wordline of the memory cell; and
a source connected to the PMOS transistor.

5. The memory cell as claimed in claim 4, wherein the thickness of the gate oxide layer of the NMOS transistor causes the gate oxide layer of the NMOS transistor to be undamaged when exposed to the programming current.

6. The memory cell as claimed in claim 5, wherein the bitline receives a voltage of six volts and the wordline receives a voltage of seven volts in response to the programming current.

7. The memory cell as claimed in claim 2, wherein:
a value of gate oxide leakage current through the PMOS transistor when the memory cell has not been programmed represents a memory state of zero in the NMOS transistor; and
a value of gate oxide leakage current through the PMOS transistor when the memory cell has been programmed represents a memory state of one in the NMOS transistor.

8. The memory cell as claimed in claim 7, wherein:
the value of gate oxide leakage current through the PMOS transistor when the memory cell has not been programmed is in a range of ten nanoamperes to one hundred nanoamperes; and
the value of gate oxide leakage current through the PMOS transistor when the memory cell has been programmed is in a range of one hundred microamperes to three hundred microamperes.

9. The memory cell as claimed in claim 7, wherein a retention period of the memory state of the memory cell is at least several hundred years.

10. An electrically programmable read only memory (EPROM) device that comprises at least one memory cell, each memory cell comprising at most two transistors, including:
- a select transistor that comprises an n-channel metal oxide semiconductor (NMOS) transistor having a gate oxide layer that has thickness of approximately sixty Angstroms; and
- a breakdown transistor connected to the select transistor, wherein the breakdown transistor comprises a p-channel metal oxide semiconductor (PMOS) transistor having a gate oxide layer that has a thickness of approximately twenty Angstroms, wherein the gate oxide layer of the PMOS transistor is broken down when exposed to a programming current in a range of ten microamperes to one hundred microamperes,
- wherein the select transistor sources said programming current on to at least one of a drain, a source and an N well of the breakdown transistor, and
- a gate of the breakdown transistor is connected to a ground potential.

11. The EPROM device as claimed in claim 10, wherein the thickness of the gate oxide layer of the NMOS transistor causes the gate oxide layer of the NMOS transistor to be undamaged when exposed to the programming current.

12. The EPROM device as claimed in claim 11, wherein the select transistor experiences a gate voltage of seven volts and a drain voltage of six volts in response to the programming current.

13. The EPROM device as claimed in claim 10, wherein the NMOS transistor comprises:
- a drain connected to a bitline of the at least one memory cell, a gate connected to a wordline of the at least one memory cell, and a source connected to the PMOS transistor.

14. The EPROM device as claimed in claim 13, wherein the thickness of the gate oxide layer of the NMOS transistor causes the gate oxide layer of the NMOS transistor to be undamaged when exposed to the programming current.

15. The EPROM device as claimed in claim 14, wherein the bitline receives a voltage of six volts and the wordline receives a voltage of seven volts in response to the programming current.

16. The EPROM device as claimed in claim 11, wherein:
- a value of gate oxide leakage current through the PMOS transistor when the memory cell has not been programmed represents a memory state of zero in the NMOS transistor; and
- a value of gate oxide leakage current through the PMOS transistor when the memory cell has been programmed represents a memory state of one in the NMOS transistor.

17. The EPROM device as claimed in claim 16, wherein:
- the value of gate oxide leakage current through the PMOS transistor when the memory cell has not been programmed is in a range of ten nanoamperes to one hundred nanoamperes; and
- the value of gate oxide leakage current through the PMOS transistor when the memory cell has been programmed is in a range of one hundred microamperes to three hundred microamperes.

18. The EPROM device as claimed in claim 16, wherein a retention period of the memory state of the memory cell is at least several hundred years.

19. A method of operating an array of electrically programmable read only memory (EPROM) memory cells in which each memory cell comprises at most two transistors, the method comprising the steps of:
- for each memory cell, connecting to a wordline of the array a gate of an NMOS select transistor that has a gate oxide layer that has a thickness of approximately sixty Angstroms, connecting a drain of the NMOS select transistor to a bitline of the array, and connecting a source of the NMOS select transistor to a PMOS breakdown transistor that has a gate oxide layer that has a thickness of approximately twenty Angstroms;
- for each memory cell, connecting a gate of the PMOS breakdown transistor to ground, connecting a source, drain and N well of the PMOS breakdown transistor to the source of the NMOS select transistor, and
- wherein the NMOS select transistor sources a programming current on to the PMOS breakdown transistor; and
- programming a selected one of the memory cells of the array to a memory state by breaking down the gate oxide layer of the PMOS breakdown transistor of the selected memory cell, wherein the programming step comprises exposing the gate oxide layer of the PMOS breakdown transistor to said programming current in a range of ten microamperes to one hundred microamperes.

20. The method as claimed in claim 19 wherein the select transistor experiences a gate voltage of seven volts and a drain voltage volts in response to the programming current.

21. The method as claimed in claim 19, wherein the programming step further comprises:
- placing a programming wordline high voltage on a wordline of the selected memory cell;
- placing a programming voltage on a bitline of the selected memory cell; and
- breaking down the gate oxide layer of the PMOS breakdown transistor of the selected memory cell without damaging the NMOS select transistor of the selected memory cell.

22. The method as claimed in claim 19, further comprising the step of:
- determining a memory state of the selected memory cell by:
  - placing a programming wordline low voltage on a wordline of the selected memory cell;
  - placing a read voltage on a bitline of the selected memory cell; and
  - determining the memory state of the selected memory cell from a value of gate oxide leakage current of the PMOS breakdown transistor.

23. The method as claimed in claim 19, wherein the thickness of the gate oxide layer of the NMOS transistor causes the gate oxide layer of the NMOS transistor to be undamaged when exposed to the programming current.

* * * * *